United States Patent
Summerfelt et al.

(10) Patent No.: US 8,058,677 B2
(45) Date of Patent: Nov. 15, 2011

(54) STRESS BUFFER LAYER FOR FERROELECTRIC RANDOM ACCESS MEMORY

(75) Inventors: Scott R. Summerfelt, Garland, TX (US); Kezhakkedath R. Udayakumar, Dallas, TX (US); John P. Campbell, Dallas, TX (US); Hugh P. McAdams, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 194 days.

(21) Appl. No.: 12/396,976

(22) Filed: Mar. 3, 2009

(65) Prior Publication Data

US 2009/0321964 A1    Dec. 31, 2009

Related U.S. Application Data

(60) Provisional application No. 61/075,820, filed on Jun. 26, 2008.

(51) Int. Cl.
*H01L 23/28* (2006.01)
(52) U.S. Cl. ............... 257/295; 257/787; 257/E23.116
(58) Field of Classification Search ............... 257/787, 257/295, E23.116, E21.502; 438/127
See application file for complete search history.

(56) References Cited

U.S. PATENT DOCUMENTS

| 5,923,081 | A  | * | 7/1999 | Tandy ........................... 257/669 |
| 6,791,168 | B1 | * | 9/2004 | Connell et al. ................ 257/668 |
| 6,995,041 | B2 | * | 2/2006 | Connell et al. ................ 438/112 |

OTHER PUBLICATIONS

Manish Ranjan et al., "How buffer layers can provide stress management for wafer-level chip-scale packages," Solid State Technology, Aug. 2004, http://sst.pennnet.com/display_article/209659/5/ARTCL/none/none/1/How-buffer-layers-can-provide-stress-management-for-wafer-level-chip-scale-packages/, 2009 PennWell Corporation, Tulsa, OK, United States.

* cited by examiner

*Primary Examiner* — Roy Potter
(74) *Attorney, Agent, or Firm* — Rose Alyssa Keagy; Wade J. Brady, III; Frederick J. Telecky, Jr.

(57) ABSTRACT

An F-RAM package having a semiconductor die containing F-RAM circuitry, a mold compound, and a stress buffer layer that is at least partially located between the semiconductor die and the mold compound. Also, a method for making an F-RAM package that includes providing a semiconductor die containing F-RAM circuitry, forming a patterned stress buffer layer over the semiconductor die, and forming a mold compound coupled to the stress buffer layer.

9 Claims, 2 Drawing Sheets

STRESS BUFFER LAYER FOR FERROELECTRIC RANDOM ACCESS MEMORY

CROSS-REFERENCE TO PROVISIONAL APPLICATION

This application claims the benefit of U.S. Provisional Application No. 61/075,820 filed Jun. 26, 2008, which is commonly assigned and incorporated herein by this reference.

BACKGROUND OF THE INVENTION

This invention relates to the packaging of a semiconductor die containing Ferroelectric Random Access Memory.

DETAILED DESCRIPTION OF THE INVENTION

Figure 1:
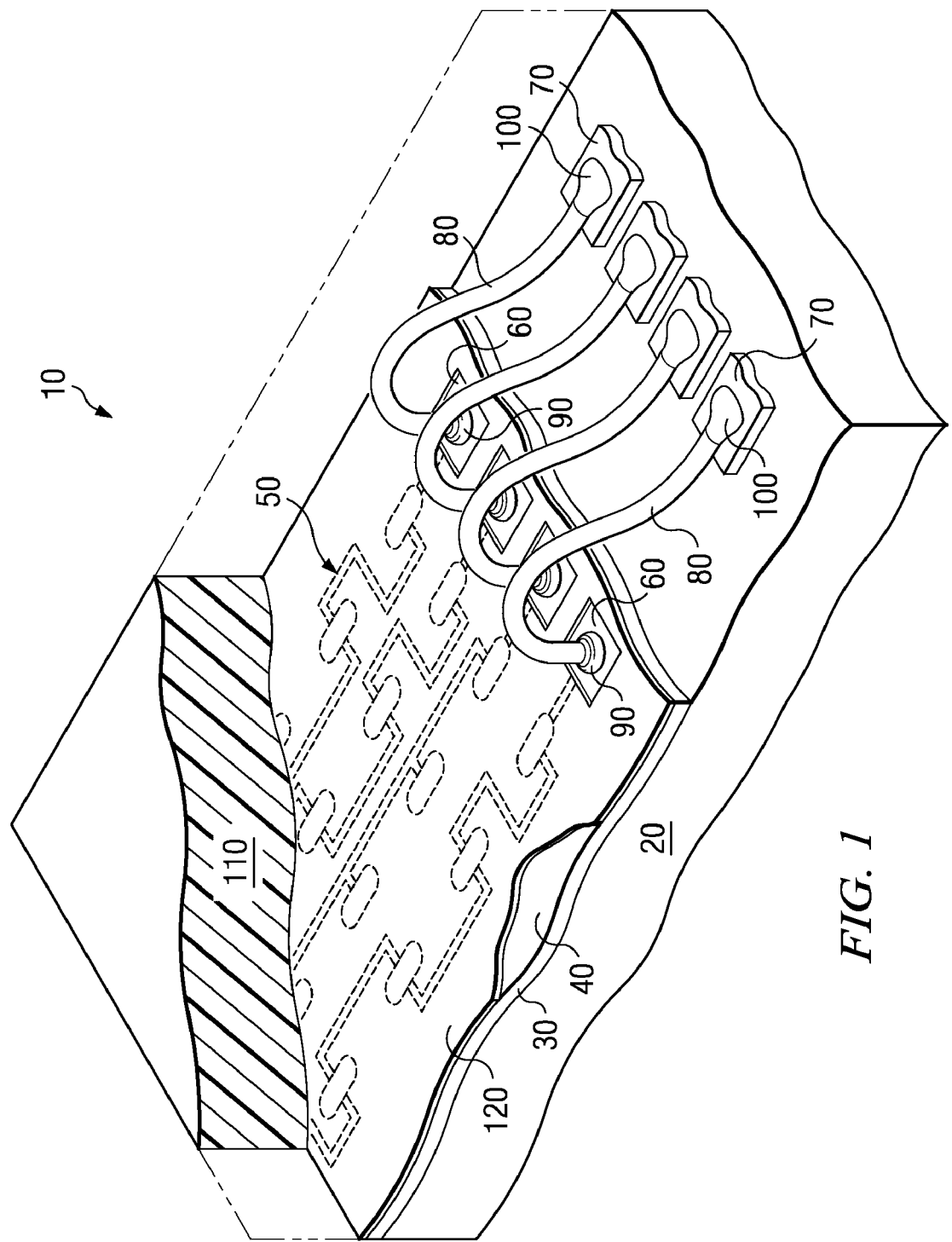
FIG. 1 is a cross-sectional view of an F-RAM package in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a ferroelectric random access ("F-RAM") package 10 in accordance with the present invention. In the example application, the F-RAM package 10 includes package substrate 20 and a bonded semiconductor die 30 containing F-RAM circuitry. The F-RAM circuitry is located on the active surface 40 of the semiconductor die 30, as represented by the markings 50 for illustration purposes. F-RAM circuitry 50 within the semiconductor die 30 may be discrete or embedded. Therefore, the semiconductor die 30 may contain F-RAM circuitry exclusively, or the semiconductor die 30 may contain F-RAM circuitry plus additional circuitry such as a processor.

The F-RAM package 10 also includes contact pads 60 that connect portions of the F-RAM circuitry 50 to lead tips 70 of the package substrate 20. In the example application, wires 80 (which are typically gold wires) are coupled to the contact pads 60 by balls 90 and also coupled to the lead tips 70 by stitches 100. The wires 80 electrically connect the F-RAM circuitry 50 of the semiconductor die 30 to the package substrate 20.

The F-RAM package 10 further includes mold compound 110 (such as epoxy or resin) that protects and encapsulates the objects located on the surface of the package substrate 20. The mold compound 110 is electrically insulating, moisture-impenetrable, and mechanically strong. Generally, the mold compound 110 is mechanically strong because it incorporates silicon or silicon dioxide particles. In addition to adding mechanical strength, the particles adjust the thermal expansion coefficient ("CTE") of the mold compound so that it better matches the properties of the integrated circuit.

An unsolved problem with F-RAM circuitry that is experienced in the marketplace is an undesirable level of clustered weak bits. The presence of cluster bits reduces the data signal margin (e.g. the ability of the sense amp to read a bit due to reduced switch polarization) and results in weakened ferroelectric memory bits that have a shortened time to failure.

While working to determine the cause of the cluster bit problem, the inventors theorized that the silicon or silicon dioxide particles that are contained within the mold compound 110 created regions of localized compressive stress on the surface of the semiconductor die 30. That theory resulted from their investigation showing that the cluster bits disappeared when the mold compound 110 was removed from locations above the F-RAM circuitry 50 of the semiconductor die 30. Further investigations by the inventors revealed that the footprint of the clustered bits was similar to the outline of the particles within the mold compound—taking into consideration the fact that stress is generally transmitted outwards at a 45° angle through F-RAM circuitry 50.

The data from those investigations also showed that the diameter of the cluster bit regions (i.e. the cluster bit footprint) matched the thickness of all material layers located above the ferroelectric capacitor level of the F-RAM circuitry 50. Specifically, the ferroelectric layer of the F-RAM circuitry 50 is generally located about 3 µm below the top surface of the semiconductor die 30 and the inventors observed that the typical size of the cluster error bits was about 6 µm wide with a generally circular shape. The regions of localized compressive stress were eventually attributed to the switch polarizations problems observed with the F-RAM circuitry 50.

In summary, it was theorized by the inventors that the cluster bits are caused by the silicon or silicon dioxide particles in the mold compound that are in physical contact with the surface of the F-RAM circuitry 50. Experiments showed the inventors that the differential stress on the mold compound exerted a point stress originating from the silicon or silicon dioxide particles onto the surface of the semiconductor die 30. The point stress from the silicon or silicon dioxide particles created a local compressive stress that spread outwards below the surface of the semiconductor die 30.

The inventors' solution to the issue of mold compound compressive stress is the use of a dielectric stress buffer layer 120 that is located between the F-RAM circuitry 50 of the semiconductor die 30 and the mold compound 110, as shown in FIG. 1. The stress buffer layer 120 has a thickness greater than 3 µm and is preferably between 3-20 µm thick.

Moreover, the inventors' solution to the issue of mold compound compressive stress is the added use of a dielectric stress buffer layer 120 that has an elastic modulus that is less than the elastic modulus of materials that are currently located above the layer of ferroelectric material within the semiconductor die 30 (such as $SiO_2$, SiN, and Cu). Therefore, the stress buffer layer 120 of the present invention has an elastic modulus below $10.5 \times 10^6$ psi. In the example application shown in FIG. 1, the stress buffer layer 120 has an elastic modulus below $2 \times 10^6$ psi.

It is to be noted that windows that are etched through the stress buffer layer 120 expose selected locations within the semiconductor die 30, as shown in FIG. 1 and described infra. In the example application, the stress buffer layer 120 is removed above the contact pads 60 to facilitate the formation of wires 80 between the contact pads 60 and the lead tips 70.

In the first embodiment of the present invention, the stress buffer layer 120 is a photopatternable silicone. Examples of commercially available photopatternable silicone 120 are photodefinable spin-on silicones (such as Dow Corning's WL-5000 Series® silicones) and wafer permanent resist (such as DuPont's PerMx Series® microlithographic polymer films). Photopatternable silicone is applied to the semiconductor die 30 using low temperature processes (e.g. under 250° C.). Therefore, the low thermal budget requirements for F-RAM fabrication are not violated (preventing the degradation of the ferroelectric polarization within the F-RAM circuitry).

However, it is within the scope of the invention to use other materials for the stress buffer layer 120. For example, in an alternative embodiment of the present invention, the stress buffer layer 120 is photosensitive polyimide ("PI"), which is commercially available from many manufacturers (and it has a higher cure temperature of <400° C.). In another alternative embodiment of the present invention, the stress buffer layer 120 is photosensitive benzocyclobutenes ("BCB") (available from Dow Chemical® under the trade name Cyclotene). In yet another alternative embodiment of the present invention, the stress buffer layer 120 is poly-p-phenylenebenzobisoxazole ("PBO"), which is commercially available from Sumitomo Bakelite Company. Experiments conducted by the inventors showed that the presence of PBO between the F-RAM circuitry 50 and the mold compound reduced the occurrence of cluster bits within the F-RAM circuitry 50. In one trial, a yield improvement of over 25% was attained with the use of PBO as a stress buffer layer. The inventors believe that the stress buffer layer 120 lowers the point stresses of the particles within the mold compound to a level where the particles have minimal negative impact on the ferroelectric properties of the ferroelectric layer within the F-RAM circuitry 50.

Referring again to the drawings, FIGS. 2A-2D are cross-sectional views of a partially fabricated semiconductor wafer 150 illustrating a process for forming the stress buffer layer 120 of FIG. 1 in accordance with the present invention. The uncut semiconductor wafer 150 contains F-RAM die segments 35 and scribe locations 160 (where the wafers are later sawed into individual dies 30). The following example application is exemplary but not restrictive of alternative ways of implementing the principles of the invention. Moreover, features and procedures whose implementations are well known to those skilled in the art are omitted for brevity. For example, the implementation of common fabrication steps lies within the ability of those skilled in the art and accordingly any detailed discussion thereof may be omitted.

Figure 2A:
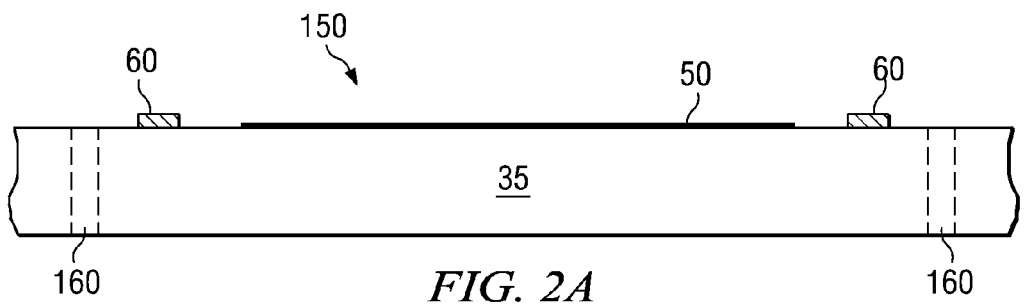
FIGS. 2A-2D are cross-sectional diagrams of a process for forming an F-RAM package in accordance with an embodiment of the invention.

FIG. 2A is a cross-sectional view of an uncut semiconductor wafer 150 at an intermediate step in the integrated circuit fabrication process. As noted supra, each semiconductor die segment 35 of the semiconductor wafer 150 includes discrete or embedded F-RAM circuitry 50 that is located within its active silicon surface. At this stage in the fabrication process, the uncut semiconductor wafer 150 also includes contact pads 60 and scribe lines 160.

Figure 2B:
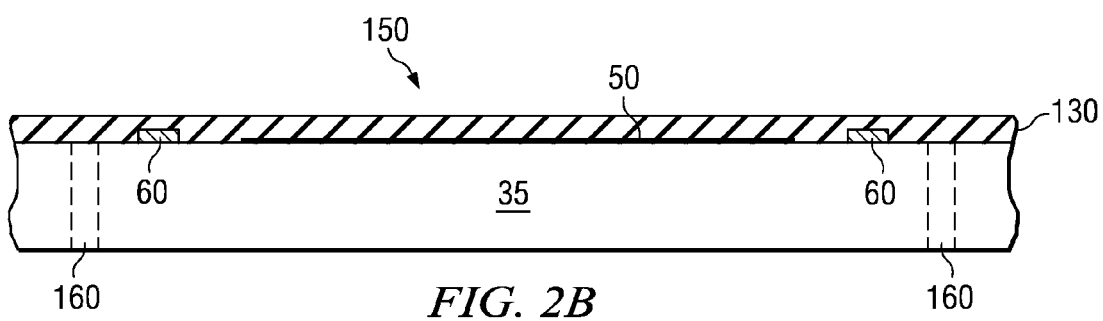

Next, a patterned stress buffer layer 120 is formed over the uncut semiconductor wafer 150. The first step in forming the patterned stress buffer layer 120 is the spin coating of a conformal film of the stress buffer material 130 across the top surface of the semiconductor wafer 150, as shown in FIG. 2B. In accordance with the present invention, the stress buffer layer has a thickness greater than 3 μm and an elastic modulus less than $2 \times 10^6$ psi. The precursor of the stress buffer material 130 in this example embodiment is photoimageable. Any standard machine (such as the ACT 8 sold by TEL®) may be used to form the stress buffer film 130.

Figure 2C:
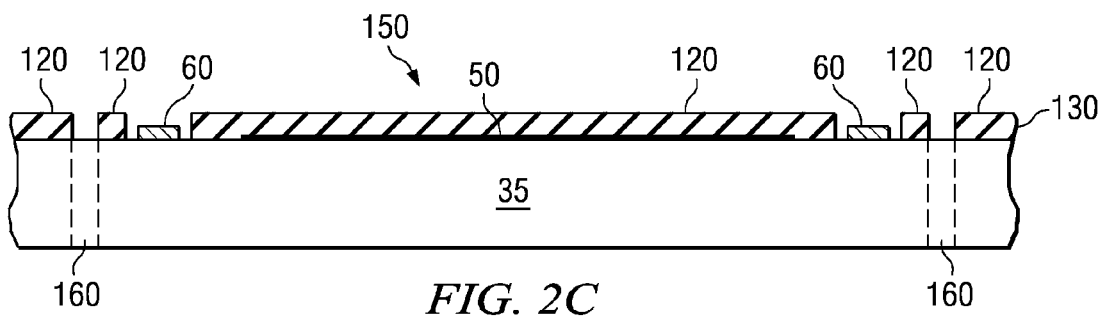

After a standard development process, a patterned stress buffer material 120 is formed over the uncut semiconductor wafer 150, as shown in FIG. 2C. In this example application, the patterned stress buffer layer 120 exposes the contact pads 60, input/output terminals (not shown), and scribe lines 160. Any developer recommended by the supplier of the stress buffer material may be used to pattern the photoimageable conformal stress buffer film 130.

Figure 2D:
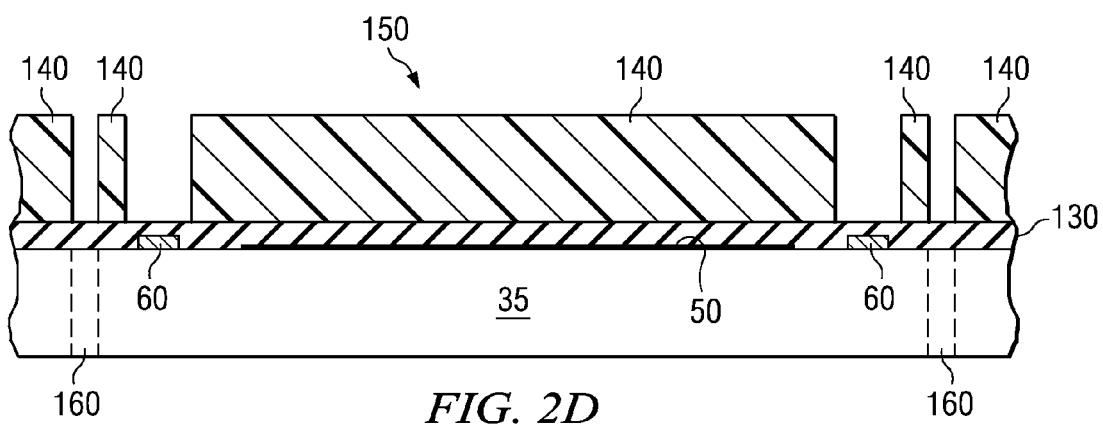

It is to be noted that in fabrication processes where the stress buffer material 130 is not photoimageable, a patterned photoresist 140 may be used as a mask for developing the stress buffer film 130, as shown in FIG. 2D. If used, the patterned photoresist 140 will designate which portions of the non-photoimageable stress buffer layer 130 will be removed through a patterning process that uses ultra violet light. The patterned photoresist 140 is removed (before the next process step) with a standard ash and clean process, resulting in the structure shown in FIG. 2C.

Once the patterned stress buffer layer 120 shown in FIG. 2C is formed, it is cured. In one embodiment, the cure is done in a standard furnace (such as the Alpha sold by TEL®) at a temperature between 150-350° C. In another embodiment, the patterned stress buffer layer 120 is cured at temperatures between 150-250° C. to guard against an unacceptable reduction in the data signal margin of the circuitry 50. In this alternative embodiment, the cure may be performed in a rapid thermal processing ("RTP") tool (available from companies such as Lambda Technologies) having the capability of producing variable frequency microwaves. The use of cure temperatures below 250° C. also minimizes the effect of CTE mismatches between the various materials comprising the semiconductor wafer 150.

The semiconductor wafer 150 is now ready for standard assembly, test, and packaging processes. In general, those processes may include depositing a standard mold compound 110 over the semiconductor wafer 150 and sawing the uncut semiconductor wafer 150 along the scribe lines 160 to create individual semiconductor dies 30. Each semiconductor die 30 is eventually attached to a package substrate 20 where wires 80 are added to form electrical contacts between the semiconductor die 30 and the package lead tips 70 (as shown in FIG. 1).

Various additional modifications to the invention as described above are within the scope of the claimed invention. As an example, instead of forming the conformal film of the stress buffer material 130 across the surface of a semiconductor wafer 150, the stress buffer layer 120 may be applied after the semiconductor wafer 150 has been sawed (and individual dies 30 created). In that alternative fabrication process, the stress buffer layer 120 would be formed by a process that dispenses a drop of the liquid stress buffer layer precursor onto the semiconductor 30 after it has been mounted onto the package substrate 20 (e.g. before the mold compound 110 is applied). Alternatively, smaller or more rounded silicon or silicon dioxide particles may be used within the mold compound 110 to reduce the cluster bit problems caused by the mold compound 110. For example, Hitachi CEL 9510HF10 mold compound is highly filled (i.e. approx. 88%) with exclusively spherical particles.

In addition, the package substrate 20 of FIG. 1 may be the chip mount pad of a prefabricated lead frame. Alternatively, the package substrate 20 may be a ball grid array ("BGA"). Moreover, semiconductor die 30 may be flip-chip bonded (using bumps and underfill material) to the package substrate 20. Furthermore, more than one semiconductor die 30 may be electrically coupled to the package substrate 20.

It is also within the scope of the invention to have additional windows through the stress buffer layer 120 to the F-RAM circuitry 50 in order to provide wire bonding access to additional circuitry—such as power supplies and input/output terminals. In addition, the stress buffer layer 120 may contain more than one material. For example the stress buffer layer may contain a PBO film plus a photopatternable silicone film. Alternatively, a sacrificial inorganic protective film may be deposited over the surface of the uncut semiconductor wafer 150 before applying the stress buffer film 130. In this alternative embodiment, the thickness of the sacrificial inorganic protective film may be less than 1000 Å thick and it may contain silicon nitride, silicon dioxide, or phosphorous silicon dioxide. (This sacrificial inorganic protective film may be removed with a dry etch process after the patterned stress buffer layer is cured.) Moreover, the methods described supra may include one or more cleaning processes for optimum fabrication yield.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An F-RAM package, comprising:
    a semiconductor die containing F-RAM circuitry;
    a mold compound coupled to said semiconductor die of said F-RAM package; and
    an unplanarized stress buffer layer that is at least partially located between said semiconductor die and said mold compound.

2. The F-RAM package of claim 1, wherein said semiconductor die is a discrete F-RAM device.

3. The F-RAM package of claim 1, wherein said semiconductor die also contains a processor.

4. The F-RAM package of claim 1, wherein said stress buffer layer comprises poly-p-phenylenebenzobisoxazole.

5. The F-RAM package of claim 1, wherein said stress buffer layer comprises photosensitive polyimides.

6. The F-RAM package of claim 1, wherein said stress buffer layer comprises photopatternable silicone.

7. The F-RAM package of claim 1, wherein said stress buffer layer comprises photosensitive benzocyclobutenes.

8. The F-RAM package of claim 1, wherein said stress buffer layer has a thickness greater than 3 μm and an elastic modulus less than $2 \times 10^6$ psi.

9. An F-RAM package, comprising:
    a semiconductor die containing F-RAM circuitry;
    a mold compound coupled to said semiconductor die of said F-RAM package; and
    an unplanarized stress buffer layer that is at least partially located between said semiconductor die and said mold compound;
    wherein said stress buffer layer comprises photopatternable silicone, and further wherein said stress buffer layer has a thickness greater than 3 μm and an elastic modulus less than $2 \times 10^6$ psi.

* * * * *